US012692378B2

(12) United States Patent
Kauffman et al.

(10) Patent No.: US 12,692,378 B2
(45) Date of Patent: Jul. 28, 2026

(54) HOT MELT COMPOSITION IN THE FORM OF A FILM FOR USE IN PHOTOVOLTAIC MODULES

(71) Applicant: H.B. Fuller Company, St. Paul, MN (US)

(72) Inventors: Thomas F. Kauffman, Easton, PA (US); Jayesh G. Bokria, South Windsor, CT (US)

(73) Assignee: H.B. Fuller Company, St. Paul, MN (US)

( * ) Notice: Subject to any disclaimer, the term of this patent is extended or adjusted under 35 U.S.C. 154(b) by 120 days.

(21) Appl. No.: 18/611,600

(22) Filed: Mar. 20, 2024

(65) Prior Publication Data
US 2024/0317983 A1 Sep. 26, 2024

Related U.S. Application Data

(60) Provisional application No. 63/491,429, filed on Mar. 21, 2023.

(51) Int. Cl.
| | |
|---|---|
| *C08L 23/14* | (2006.01) |
| *B32B 7/12* | (2006.01) |
| *B32B 17/06* | (2006.01) |
| *C08L 23/16* | (2006.01) |
| *H10F 19/80* | (2025.01) |
| *H10F 19/85* | (2025.01) |
| *H10F 77/123* | (2025.01) |

(52) U.S. Cl.
CPC ................ *C08L 23/14* (2013.01); *B32B 7/12* (2013.01); *B32B 17/06* (2013.01); *C08L 23/16* (2013.01); *H10F 19/804* (2025.01); *H10F 19/85* (2025.01); *B32B 2457/12* (2013.01); *C08L 2205/025* (2013.01); *C08L 2205/035* (2013.01); *H10F 19/807* (2025.01); *H10F 77/123* (2025.01)

(58) Field of Classification Search
CPC ...... H10F 19/80; H10F 19/804; H10F 19/807; H10F 19/85; H10F 77/123; B32B 7/12; B32B 17/06; B32B 2457/12; C08L 23/14; C08L 23/16; C08L 2205/025; C08L 2205/035
See application file for complete search history.

(56) References Cited

U.S. PATENT DOCUMENTS

| | | | |
|---|---|---|---|
| 8,440,904 B2 | 5/2013 | Solis et al. | |
| 8,525,017 B2 | 9/2013 | Mori et al. | |
| 8,592,679 B2 | 11/2013 | Patel et al. | |
| 8,653,166 B2 | 2/2014 | Strzegowski et al. | |
| 8,957,304 B2 | 2/2015 | Sato et al. | |
| 9,447,272 B2 | 9/2016 | Taniguchi et al. | |
| 9,676,928 B2 | 6/2017 | Liu et al. | |
| 9,806,213 B2 | 10/2017 | Jung et al. | |
| 10,062,795 B2 | 8/2018 | Nishioka et al. | |
| 2010/0154867 A1* | 6/2010 | Bennison .............. | H10F 19/807 156/60 |
| 2013/0017379 A1* | 1/2013 | Hoya .................... | B32B 27/065 428/212 |
| 2017/0226321 A1* | 8/2017 | Bonekamp .............. | H10F 19/85 |
| 2018/0002578 A1* | 1/2018 | Kauffman ................. | B32B 7/12 |
| 2018/0019423 A1 | 1/2018 | Ninomiya et al. | |
| 2018/0102500 A1 | 4/2018 | Harai | |
| 2019/0382630 A1* | 12/2019 | Zhou ........................ | C08L 23/14 |
| 2021/0002465 A1* | 1/2021 | Iwashita ................. | B32B 27/32 |

FOREIGN PATENT DOCUMENTS

| | | |
|---|---|---|
| CN | 102916072 | 5/2015 |
| EP | 3563423 | 8/2020 |
| JP | 6248700 B2 * | 12/2017 |
| KR | 101472712 | 12/2014 |

OTHER PUBLICATIONS

JP-6248700-B2 English machine translation (Year: 2017).*

* cited by examiner

*Primary Examiner* — Andrew J Golden
(74) *Attorney, Agent, or Firm* — Kristi Halloran

(57) ABSTRACT
The invention features a hot melt composition in the form of a film including a blend of propylene based polymers and ethylene based polymers. The hot melt composition in the form of a film is useful as an encapsulant for photovoltaic modules.

17 Claims, No Drawings

HOT MELT COMPOSITION IN THE FORM OF A FILM FOR USE IN PHOTOVOLTAIC MODULES

CROSS REFERENCE TO RELATED APPLICATIONS

This application claims the benefit of U.S. Provisional Application No. 63/491,429, filed Mar. 21, 2023, which is incorporated herein.

BACKGROUND

A crystalline silicon photovoltaic (PV) module commonly includes a photovoltaic layer, usually mono or multi-crystalline silicon, laminated between two encapsulant layers, with a thick glass substrate as the front layer and a protective back sheet. Additional layers can be found between these layers e.g., tie layers and adhesives. The crystalline PV module is rigid. The crystalline PV module can often have a breathable construct i.e., there is no seal holding it together at the edges. As such, low cost encapsulants e.g., peroxide cured alkyl acetates can be used since left over peroxide residues can diffuse through the edges into the atmosphere and thus not harm the module.

A thin film PV module includes photovoltaic cells that are thinner and less expensive. A thin film PV module commonly includes a front sheet on which the photovoltaic cells can be deposited, an encapsulant, and a back sheet. However, since there is generally an edge seal present around the outer edge of a thin film PV module, materials such as peroxide, or polymers that break down to form acid e.g., ethylene vinyl acetate cannot be used in the encapsulant. This is because the materials that form would be trapped in the module and could damage it. Further, in the thin film PV module since there is often only one layer of encapsulant, there is an increased stress put on the encapsulant.

Propylene based olefin polymers are often preferred from a supply and cost perspective. However, it can be difficult to find propylene based polymers that have the correct balance of properties needed to work well in an encapsulant.

There is a need for encapsulants that work well for both crystalline silicon PV modules and thin film PV modules, that are free of materials that can contaminate the module e.g., peroxides, acids, etc., provide a balance of heat resistance and adhesion, withstand environmental changes, and include propylene based polymers.

GLOSSARY

In reference to the invention, these terms have the meanings set forth below:

The term "copolymer" means a polymer derived from two or more distinct monomers.

SUMMARY

In one aspect, the invention features a hot melt composition in the form of a film including from 20% by weight to 70% by weight of a propylene based polymer having a peak melting temperature ($T_m$) by DSC of no more than 120° C., from 20% by weight to 70% by weight of an ethylene based polymer having a density of no more than 0.93 g/cm³, and from 2% by weight to 15% by weight of a functionalized polymer comprising a functional group selected from the group consisting of epoxides, carboxylic anhydrides, and carboxylic acids. In another aspect, the invention features a hot melt composition in the form of a film including from 20% by weight to 70% by weight of a propylene based polymer having a $T_m$ by DSC of no more than 120° C., from 20% by weight to 70% by weight of an ethylene based polymer having a density of no more than 0.93 g/cm³, and at least two of the following: from 2% by weight to 10% by weight of a first functionalized polymer selected from the group consisting of a copolymer of ethylene and maleic anhydride, a copolymer of ethylene, alkyl(meth)acrylate and maleic anhydride, from 2% by weight to 10% by weight of a second functionalized selected from a group consisting of a copolymer of ethylene and glycidyl methacrylate and a terpolymer of ethylene, alkyl(meth)acrylate and glycidyl methacrylate, and from 0.1% by weight to 3.0% by weight of a silane adhesion promoter.

In another aspect, the invention features a hot melt composition in the form of a film including from 20% by weight to 60% by weight of a propylene based copolymer having a $T_m$ by DSC of no more than 120° C. and a comonomer content of from 9% by weight to 22% by weight, from 35% by weight to 60% by weight of a single site catalyzed ethylene based polymer having a density of no more than 0.90 g/cm³, from 2% by weight to 15% by weight of a functionalized polymer comprising a functional group selected from the group consisting of epoxides, carboxylic anhydrides, and carboxylic acids, and a silane adhesion promoter.

In one embodiment, the propylene based polymer is a propylene ethylene copolymer. In another embodiment, the propylene based polymer is a non-single site catalyzed amorphous poly alpha olefin. In a different embodiment, the non-single site catalyzed amorphous poly alpha olefin has a comonomer content of from 12% by weight to 22% by weight and a $T_m$ by DSC of no more than 110° C.

In one embodiment, the non-single site catalyzed amorphous poly alpha olefin is produced with an electron donor catalyst. In another embodiment, the propylene based polymer is selected from the group consisting of non-single site catalyzed amorphous poly alpha olefin (APAO), single site catalyzed propylene based polymer and combinations thereof.

In still another embodiment, the ethylene based polymer is a single site catalyzed copolymer. In a different embodiment, the ethylene based polymer is selected from the group consisting of very low density polyethylene (VLDPE), low density polyethylene (LDPE) and linear low density polyethylene (LLDPE). In one embodiment, the ethylene based polymer has a density as tested according to ASTM D 792 of no greater than 0.89 g/cm³.

In one embodiment, the functionalized polymer is selected from the group consisting of copolymer of ethylene and maleic anhydride, copolymer of ethylene, alkyl(meth) acrylate and maleic anhydride, copolymer of ethylene and glycidyl methacrylate and terpolymer of ethylene, alkyl (meth)acrylate and glycidyl methacrylate. In another embodiment, the functionalized polymer is present as a first and a second functionalized polymer, the first functionalized polymer is selected from the group consisting of copolymer of ethylene and maleic anhydride, copolymer of ethylene, alkyl(meth)acrylate and maleic anhydride and, the second functionalized polymer is selected from a group consisting of copolymer of ethylene and glycidyl methacrylate and terpolymer of ethylene, alkyl(meth)acrylate and glycidyl methacrylate.

In one embodiment, the hot melt composition is free of ethylene vinyl acetate, peroxide, and poly vinyl chloride. In a different embodiment, the hot melt composition has an approximate Melt Index of from 5 g/10 min to 150 g/10 min as tested according to ASTM D 1238 (190° C., 2.16 kg).

In another embodiment, the hot melt composition further includes a silane adhesion promoter. In a different embodiment, the silane adhesion promoter is a bifunctional silane adhesion promoter selected from the group consisting of amino silane, epoxy silane, isocyanurate silane. In one embodiment, the hot melt composition further includes from 5% by weight to 50% by weight of a filler. In another embodiment, the hot melt composition further includes at least one of a tackifying agent and a wax. In a different embodiment, the wax is selected from the group consisting of polyethylene waxes, Fischer Tropsch waxes, metallocene catalyzed polyethylene waxes, and combinations thereof.

In one embodiment, the hot melt composition further includes an aliphatic hydrocarbon tackifying agent.

In one embodiment, the invention includes a photovoltaic module hot melt composition of this invention in the form of a film.

In one embodiment, the invention includes a photovoltaic module including from top to bottom a front sheet, the hot melt composition in the form of a film, a layer of photovoltaic cells, the hot melt composition in the form of a film, and a back sheet, wherein the hot melt composition in the form of a film adheres the front sheet to the back sheet.

In a different embodiment, the invention includes a photovoltaic module including a front sheet, a layer of photovoltaic cells in contact with the front sheet, the hot melt composition in the form of a film, and a back sheet, wherein the hot melt composition in the form of a film is located between the photovoltaic cells and the back sheet and adheres the front sheet to the back sheet. In another embodiment, the photovoltaic cells are selected from the group consisting of CIGS (copper indium gallium diselenide), CdTe (cadmium telluride), amorphous thin-film silicon (a-Si, TF-Si) and copper indium diselenide (CIS) and perovskite based systems.

In one embodiment, the photovoltaic module further includes an edge seal. In another embodiment, the back sheet and the front sheet are glass, and the photovoltaic cells are CdTe.

The hot melt compositions in the form of a film of this invention include a specific blend of ethylene based and propylene based polymers, are free of materials that can contaminate the module e.g., peroxides, acids, etc., and provide a balance of heat resistance and adhesion.

DETAILED DESCRIPTION

Hot Melt Composition

This invention is directed to a hot melt composition in the form of a film, also referred to as a sheet.

A hot melt composition in the form of a film comprising can include from 20% by weight to 70% by weight of a propylene based polymer having a $T_m$ by DSC of no more than 120° C., from 20% by weight to 70% by weight of an ethylene based polymer having a density of no more than 0.93 g/cm³, and from 2% by weight to 15% by weight of a functionalized polymer comprising a functional group selected from the group consisting of epoxides, carboxylic anhydrides, and carboxylic acids.

A hot melt composition in the form of a film comprising can include from 20% by weight to 70% by weight of a propylene based polymer having a $T_m$ by DSC of no more than 120° C., from 20% by weight to 70% by weight of an ethylene based polymer having a density of no more than 0.93 g/cm³, from 2% by weight to 15% by weight of a functionalized polymer comprising a functional group selected from the group consisting of epoxides, carboxylic anhydrides, and carboxylic acids and a silane adhesion promoter.

The hot melt composition in the form of a film can include from 20% by weight to 70% by weight of a propylene based polymer having a $T_m$ by DSC of no more than 120° C. selected from propylene homopolymers, and propylene copolymers having a comonomer content of from 9% by weight 22% by weight, from 20% by weight to 70% by weight of a ethylene based polymer having a density of no more than 0.93 g/cm³, from 2% by weight to 15% by weight of at least one functionalized polymer comprising a functional group selected from the group consisting of epoxides, carboxylic anhydrides, and carboxylic acids, and a silane adhesion promoter.

The hot melt composition in the form of a film can include from 20% by weight to 60% by weight of a propylene based copolymer having a $T_m$ by DSC of no more than 120° C. and a comonomer content of from 9% by weight to 22% by weight, from 35% by weight to 60% by weight of a single site catalyzed ethylene based polymer having a density of no more than 0.90 g/cm³, from 2% by weight to 10% by weight of at least one functionalized polymer comprising a functional group selected from the group consisting of epoxides, carboxylic anhydrides, and carboxylic acids, and a silane adhesion promoter.

The hot melt composition in the form of a film can include from 20% by weight to 70% by weight of a propylene based polymer having a $T_m$ by DSC of no more than 120° C., from 20% by weight to 70% by weight of an ethylene based polymer having a density of no more than 0.93 g/cm³, and at least two of the following: from 2% by weight to 10% by weight of a first functionalized polymer selected from the group consisting of a copolymer of ethylene and maleic anhydride, a copolymer of ethylene, alkyl(meth)acrylate and maleic anhydride, from 2% by weight to 10% by weight of a second functionalized selected from a group consisting of a copolymer of ethylene and glycidyl methacrylate and a terpolymer of ethylene, alkyl(meth)acrylate and glycidyl methacrylate, and from 0.1% by weight to 3.0% by weight of a silane adhesion promoter.

The hot melt composition can be free of peroxides, ethylene vinyl acetate and poly vinyl chloride (PVC).

The hot melt composition can have an Approximate Melt Index of from 0.5 to 300 gram (g)/10 minutes (min), 0.5 to 200 g/10 min, 0.5 to 50 g/10 min, 5 to 50 g/10 min, or even from 10 to 30 g/10 min when tested according to ASTM D1238 (190° C., 2.16 kg).

The hot melt composition can have a Storage Modulus at 25° C. of from 3 MPa to 25 MPa, from 3 MPa to 20 MPa, from 3 to 15 MPa, or even from 4 MPa to 15 MPa when tested according to the Storage Modulus test method.

The hot melt composition can have a 180° Peel Adhesion of 30 Newtons (N)/cm to 250 N/cm, from 40 N/cm to 200 N/cm, or even from 60 N/cm to 200 N/cm.

Propylene Based Polymer

The hot melt composition in the form of a film includes one or more propylene based polymers having a $T_m$ by DSC melting peak of no more than 120° C.

The propylene based polymer can be produced by reacting propylene monomers and the desired comonomers in the presence of a catalyst system selected from a single site (e.g., metallocene) catalyst, a Ziegler-Natta catalyst, a catalyst system including at least one electron donor and any other catalyst that results in a polymer with the desired properties.

The propylene based polymer can be produced in the presence of a catalyst system selected from a single site (e.g., metallocene) catalyst, a Ziegler-Natta catalyst, a catalyst system including at least one electron donor and combinations thereof. The propylene based polymer can be produced in the presence of a catalyst system selected a Ziegler-Natta catalyst, a catalyst system including at least one electron donor and combinations thereof. In one embodiment, the catalyst is a Ziegler-Natta catalyst that contains a titanium containing component, an aluminum component, and an electron donor.

The propylene based polymer is derived predominantly from propylene. The propylene based polymer can include at least 60% by weight propylene, at least 70% by weight propylene, at least 75% by weight propylene, at least 80% by weight propylene, at least 90% by weight propylene, at least 95% by weight propylene, or even 100% by weight propylene.

The propylene based polymer can be a homopolymer but is preferably a copolymer. The propylene based polymer can be a copolymer of propylene and an alpha olefin. The alpha-olefin can have 2 carbon atoms, or 4-8 carbon atoms. The alpha olefin can be selected from the group consisting of ethylene, 1-butene, 1-pentene, 3-methyl-1-butene, 1-hexene, 4-methyl-1-pentene, 3-methyl-1-pentene and 1-octene. In a preferred embodiment, the alpha olefin is ethylene.

When the propylene based polymer is a copolymer, the comonomer is present at from 5% by weight, 7% by weight, 8% by weight, 9% by weight, 10% by weight, 11% by weight, 12% by weight, 13% by weight, 14% by weight, 15% by weight to 20% by weight, 22% by weight, 23% by weight, 25% by weight, 28% by weight, 35% by weight or even 40% by weight or any two values there between.

The propylene based polymer has a $T_m$ (Melting Temperature) as tested by DSC (Differential Scanning calorimeter) of no greater than 130° C., no greater than 120° C., no greater than 115° C., no greater than 110° C., from 70° C. to 120° C., from 70° C. to 115° C., from 70° C. to 110° C., or even from 70° C. to 105° C. Useful propylene based polymers also exhibit a Heat of Fusion—first heat (J/g) —of no greater than 20 J/g, no greater than 15 J/g, no greater than 10 J/g, from 0 J/g to 15 J/g, or even from 0 J/g to 10 J/g.

The propylene based polymer can be selected from the group consisting of non-single site catalyzed amorphous poly alpha olefin (APAO), single site catalyzed propylene based polymer and combinations thereof.

The propylene based polymer can be a non-single site catalyzed APAO polymer. The non-single site catalyzed APAO can be produced using an electron donor catalyst system. The non-single site catalyzed APAO can have a density of no greater than 0.89 g/cm³. The non-single site catalyzed APAO can have a Heat of Fusion (J/g) —first heat of no greater than 15 J/g, from 0 J/g to 15 J/g, or even from 0 J/g to 10 J/g. The non-single site catalyzed APAO can have a viscosity of at least 50 cP, at least 100 cP, at least 500 cP, no greater than 20,000 cP, no greater than 10,000 cP, from 50 cP to 10,000 cP, from 50 cP to 8,000 cP, or even from 50 to 5,000 cP at 190° C.

The propylene based polymer can be a single site catalyzed propylene based polymer. The single site catalyzed propylene based polymer can have a comonomer content of from 5% by weight to 25% by weight, or even 9% by weight to 20% by weight and Melt Index of from 1 to 50 g/10 min, 2 to 40 g/10 min, or even 5 to 30 g/10 min as tested according to ASTM D 1238 (190° C., 2.16 kg).

Useful propylene based polymers include the AERAFIN series of polymers including, AERAFIN 35, AERAFIN 75H AND AERAFIN 180 available from Synthomer PLC (Akron, Ohio), the VISTAMAXX series of polymers including VISTAMAXX 6202, VISTAMAXX 6502 and VISTAMAXX 8380 available from ExxonMobil Chemical Company (Houston, Texas), the LMODU series of polymers including, LMODU S901 available from Idemitsu Kosan Co., Ltd (Japan) and the VERSIFY series of polymers including VERSIFY 3200, VERSIFY 3300 AND VERSIFY 3401 available from The Dow Chemical Company (Midland, MI).

The hot melt composition can include from 20% by weight, 25% by weight, 30% by weight, 35% by weight, 40% by weight to 60% by weight, 65% by weight, 70% by weight, or any two values there between of the propylene based polymer.

Ethylene Based Polymer

The ethylene based polymer functions to lower the Glass Transition Temperature ($T_g$) and increase the modulus (or stiffness) of the composition. The ethylene based polymer can be present as one or more ethylene based polymers. The ethylene based polymer can be selected from the group consisting of very low density polyethylene (VLDPE), low density polyethylene (LDPE), linear low density polyethylene (LLDPE), ethylene alpha olefin copolymers and combinations thereof.

The ethylene based polymer can be derived predominantly, or even entirely of ethylene. The ethylene based polymer can include at least 60% by weight ethylene, at least 70% by weight ethylene, at least 75% by weight ethylene, at least 80% by weight ethylene, at least 90% by weight ethylene, at least 95% by weight ethylene or even 100% by weight ethylene.

The ethylene based polymer can be polymerized by known polymerization techniques e.g., Ziegler-Natta, single site (e.g., metallocene) catalysis, radical polymerization process in an autoclave reactor or in a tubular reactor, etc. In a preferred embodiment, the ethylene based polymer is polymerized by a single site (e.g., metallocene) catalyst.

The ethylene based polymer can have a density as tested according to ASTM D 792 of no more than 0.95 g/cm³, no more than 0.93 g/cm³, or even no more than 0.92 g/cm³. The ethylene based polymer can have a density as tested according to ASTM D 792 of from 0.82 g/cm³, 0.85 g/cm³ to 0.88 g/cm³, 0.89 g/cm³, 0.90 g/cm³, 0.92 g/cm³, 0.93 g/cm³, 0.95 g/cm³ or any two values there between. The ethylene based polymer can include a first ethylene based polymer having a density of from 0.90 g/cm³ to 0.93 cm³ and a second ethylene based polymer having a density of from 0.85 g/cm³ to 0.88 g/cm³.

The $T_m$ of the ethylene based polymer can be between 100° C. to 150° C. The melt index of the ethylene based polymer can be from 0.1 g/10 min, 0.5 g/10 min, 1 g/10 min, 5 g/10 min to 25 g/10 min, 30 g/10 min, 35 g/10 min, 40 g/10 min, 50 g/10 min, 100 g/10 min, 500 g/10 min, 1000 g/10 min or any two values there between as tested according to ASTM D-1238 (190° C., 2.16 kg).

The ethylene based copolymer can have a Mw/Mn ratio of no greater than 5, no greater than 3, or even no greater than 2, in which Mw and Mn respectively denote the weight-average molar mass and the number-average molar mass according to Gel Permeation Chromatography (GPC).

The ethylene based polymer can be selected from the group consisting of very low density polyethylene (VLDPE), low density polyethylene (LDPE) and linear low density polyethylene (LLDPE).

Useful polyethylene include LDPE LD 102 LC and LDPE LD 506.7, both available ExxonMobil Chemical Company (Houston, Texas) and AT280 available from Celanese Corporation (Irving, Texas).

The ethylene based polymer can be an ethylene copolymer. The ethylene based polymer can be a copolymer of ethylene and one or more alpha-olefin. The alpha-olefin can have from 3 to 10 carbon atoms. The alpha olefin can be selected from the group consisting of propylene, 1-butene, 1-pentene, 3-methyl-1-butene, 1-hexene, 4-methyl-1-pentene, 3-methyl-1-pentene, 1-octene, 1-decene and 1-dodecene.

Useful ethylene based copolymers include the ENGAGE series of polymers, including ENGAGE 8411, an ethylene-octene copolymer having a density of 0.88 g/cm$^3$ and a melt index of 18 g/10 min as tested according to ASTM D1238 (190° C., 2.16 kg) and ENGAGE PV8658, an ethylene-octene copolymer have a density of 0.90 g/cm$^3$ and a melt index of 30 g/10 min as tested according to ASTM D1238 (190° C., 2.16 kg) both available from The Dow Chemical Company (Midland, MI), the SOLUMER series of polymers, including SOLUMER 8613, an ethylene-octene copolymer having a density of 0.863 g/cm$^3$ and a melt index of 13 g/10 min as tested according to ASTM D1238 (190° C., 2.16 kg) available from SK Innovation Co., Ltd. (Seoul, Korea) and the VISTALON series of polymers, including VISTALON 878 available from ExxonMobil Chemical Company (Houston, Texas).

The hot melt composition can include from 20% by weight, from 25% by weight, from 30% by weight, from 35% by weight to 60% by weight, 65% by weight, 70% by weight, or any two values there between of the ethylene based copolymer.

Functionalized Polymers

The inventors have found that functionalized polymers are important to maintain the heat resistance of the hot melt composition and to improve adhesion.

The hot melt composition of this invention includes at least one functionalized polymer, or even two functionalized polymers. The functionalized polymer is not limited. The functional group can be part of the main chain of the polymer, the side chain of the polymer, or a combination thereof. The functional group can be introduced either during polymerization of the copolymer or by grafting after polymerization. The functionalized polymers can be copolymers of ethylene and various functional groups.

In a preferred embodiment, the hot melt composition is substantially free of curing agents. Curing agents include any species other than the functionalized polymer. Curing agents include materials such as e.g., peroxides, amines, phenols, etc.

The functionalized polymer includes a functional group selected from the group consisting of carboxylic anhydrides, carboxylic acids, epoxy groups and combinations thereof.

The functionalized polymer can include ethylene and a carboxylic acid anhydride functional group. The carboxylic acid anhydride functional group can be chosen, from maleic, itaconic, citraconic, allylsuccinic, cyclohex-4-ene-1,2-dicarboxylic, 4-methylenecyclohex-4-ene-1,2-dicarboxylic, bicyclo[2.2.1]hept-5-ene-2,3-dicarboxylic and x-methylbicyclo[2.2.1]hept-5-ene-2,2-dicarboxylic anhydrides.

The functionalized polymer can include ethylene and carboxylic acid. The carboxylic acid can be chosen from the group consisting of acrylic acid and methacrylic acid.

The functionalized polymer can include ethylene and an epoxy group. Examples of epoxy-containing monomer units include aliphatic esters and glycidyl ethers such as an allyl glycidyl ether, a vinyl glycidyl ether, a maleate or itaconate of glycidyl, a glycidyl methacrylate, and alicyclic esters and glycidyl ethers, such as a 2-cyclohexene-1-glycidyl ether, a cyclohexene-4,5-diglycidyl carboxylate, a cyclohexene-4 glycidyl carboxylate, a 5-norbornene-2-methyl-2-glycidyl carboxylate and an endo cis-bicyclo(2,2,1)-5-heptene-2,3-diglycidyl dicarboxylate.

The epoxy-containing monomer unit is preferably incorporated as a comonomer, i.e., by copolymerizing an olefin monomer with the vinyl group containing comonomer bearing an epoxy group (=epoxy-group containing monomer unit). Most preferably, the epoxy-group-containing monomer units are glycidyl methacrylate comonomer units.

The functionalized polymer can include a first functionalized polymer and a second functionalized polymer. The second functionalized polymer can have a functional group capable of reacting with the functional group of the first functionalized polymer.

The first functionalized polymer and/or the second functionalized polymer can be functionalized alkyl(meth)acrylates. Preference is given to alkyl(meth)acrylates having an alkyl chain comprising from 1 to 4 carbon atoms, preferably methyl, ethyl or butyl.

Alternatively, the first functionalized polymer and/or the second functionalized polymer can be functionalized ethylene alpha olefin copolymers such as e.g., ethylene alpha olefin copolymers functionalized with maleic anhydride, glycidyl methacrylate, etc.

The first functionalized polymer can be a copolymer of ethylene and an epoxy group and the second functionalized polymer can a copolymer of ethylene and at least one monomer selected from the group consisting of a carboxylic anhydride, a carboxylic acid, and combinations thereof.

The first functionalized polymer can be a copolymer of ethylene and of maleic anhydride or a copolymer of ethylene, of alkyl methacrylate and of maleic anhydride and the second functionalized polymer can be a copolymer of ethylene and of glycidyl methacrylate or a terpolymer of ethylene, of alkyl methacrylate and of glycidyl methacrylate.

The functionalized polymers can be formed by radical polymerization processes in an autoclave reactor, in a tubular reactor, or by single site (e.g., metallocene catalysis) which are techniques known to a person skilled in the art.

The functionalized polymers can have a melt index as tested by ASTM D 1238 (190° C., 2.16 kg) of from 2 g/10 min to 1000 g/10 min, from 2 g/10 min to 500 g/10 min, from 2 g/10 min to 100 g/10 min, or even from 2 g/10 min to 50 g/10 min.

Useful functionalized polymers include those available under the LOTADER trade designation including LOTADER 4210, an ethylene butyl acrylate maleic anhydride terpolymer, having 6.5% by weight butyl acrylate, 3.6% by weight maleic anhydride and a melt index of 10 g/10 min as tested by ASTM D 1238 (190° C., 2.16 kg) and LOTADER AX 8840, an ethylene glycidyl methacrylate copolymer, having 8% by weight glycidyl methacrylate and a melt index of 5 g/10 min as tested by ASTM D 1238 (190° C., 2.16 kg), both available from SK Functional Polymer (Courbevoie, France), NUCREL 0910, an ethylene methacrylic acid copolymer, having 8.7% by weight methacrylic acid and a melt index of 10 g/10 min as tested by ASTM D 1238 (190° C., 2.16 kg), ELVALOY 4170, an ethylene terpolymer having a melt index of 8 g/10 min as tested by ASTM D 1238 (190° C., 2.16 kg), FUSABOND M603, a maleic anhydride functionalized ethylene copolymer having a melt index of 25 g/10 min as tested by ASTM D 1238 (190° C., 2.16 kg) and AFFINITY GA 1000R, a maleic anhydride functionalized ethylene octene copolymer all available from Dow Chemical (Houston, Texas).

The hot melt composition includes from 2% by weight, 3% by weight, 4% by weight, 5% by weight to 7.5% by weight, 10% by weight, 15% by weight or any two values there between of the functionalized polymer.

Silane Adhesion Promoter

The hot melt adhesive composition can include a silane adhesion promoter. The silane adhesion promoter helps improve adhesion between the encapsulant and the glass. The silane adhesion promoter is not limited and can include any type of silane composition useful in promoting the adhesion of the hot melt composition to a substrate.

The silane adhesion promoter can be selected from the group consisting of a silane, an amino silane, an epoxy silane, an isocyanurate silane and any other silane. The silane adhesion promoter can be bifunctional. The silane adhesion promoter can include hydrolyzable inorganic silyl groups.

The hot melt composition can include from 0.05% by weight to 5% by weight, from 0.1% to 3% by weight, or even from 0.2% by weight to 2% by weight of the silane adhesion promoter.

Useful silane adhesion promoters include those available under the DYNASYLAN trade designation, include DYNA-SYLAN GLYMO, a bifunctional organosilane possessing a reactive organic epoxide and hydrolyzable inorganic methoxysilyl groups, DYNASYLAN AMMO, 3-(trimethoxysilyl)propylamine and DYNASYLAN VPS7161, isocyanurate silane with a high concentration of trimethoxysilyl groups all available from Evonik GmBH (Hanau, Germany) and COATOSIL MP200, an epoxy functional silane oligomer available from Momentive Performance Materials Inc.

Functionalized Polymers and Silane Adhesion Promoter

The inventors have found that a combination of the functionalized polymers and the silane adhesion promoter is helpful in improving adhesion and increasing the heat resistance of the encapsulant. In one embodiment, the hot melt composition in the form of a film includes at least two of the following: from 2% by weight to 10% by weight of a first functionalized polymer selected from the group consisting of a copolymer of ethylene and maleic anhydride, a copolymer of ethylene, alkyl(meth)acrylate and maleic anhydride, from 2% by weight to 10% by weight of a second functionalized selected from a group consisting of a copolymer of ethylene and glycidyl methacrylate and a terpolymer of ethylene, alkyl(meth)acrylate and glycidyl methacrylate, and from 0.1% by weight to 3.0% by weight of a silane adhesion promoter.

Fillers

The hot melt composition can include a filler. The filler can be selected from the group consisting of silica, treated silica, alumina, calcium carbonate, barium sulfate, zinc oxide, clay, talc, carbon nanotubes and carbon black. The hot melt composition can alternatively include any other filler.

The composition can include up to 50% by weight, from 5% by weight to 50%, from 5% by weight to 30% by weight, or even from 5% by weight to 20% by weight of a filler.

Tackifying Agent

The hot melt composition can include a tackifying agent. The hot melt composition can include more than one tackifying agent.

The tackifying agent can be a hydrocarbon tackifying agent. The tackifying agent can have a softening point of from 100° C. to 150° C., or even from 105° C. to 150° C.

The tackifying agent can be at least partially hydrogenated, or even fully hydrogenated. Suitable classes of hydrocarbon tackifying agents include, e.g., aliphatic, and cycloaliphatic hydrocarbon resins (C9 and dicyclopentadiene (DCPD) based resins).

In a preferred embodiment the tackifying agent is a hydrocarbon tackifying agent that is primarily aliphatic, or even entirely aliphatic. The hot melt composition can include more than one tackifying agent.

Useful tackifying agents are commercially available under a variety of trade designations including, e.g., ESCOREZ 5300 and ESCOREZ 5320 from Exxon Mobil Chemical Company (Houston, Tex.), EASTOTAC H-115W, H-130W and H-142W from Synthomer PLC (Akron, Ohio), RESINALL 1030 from Resinall Corp (Severn, N.C.), and SUKOREZ SU-110, SU-120, SU-130, SU-210, SU-230, SU-230S, SU-420, SU-525 from Kolon Industries, Inc. (Ulsan, Korea).

The tackifying agent is present at from 0% by weight to 20% by weight, from 3% to 20%, from 3% to 15% by weight, or even from 5% by weight to 15% by weight.

Wax

The hot melt composition can include wax. The hot melt composition can include more than one wax.

The wax can be derived from ethylene (e.g., at least about 95 mole % ethylene) and, optionally, additional co-monomers including, e.g., propylene. Suitable waxes include, e.g., paraffin waxes, polyethylene waxes, Fischer Tropsch waxes, metallocene catalyzed polyethylene waxes, and combinations thereof.

The wax can have a melt temperature by DSC ($T_m$) of at least 50° C., at least 70° C., at least 80° C., at least 90° C., at least 100° C., from 70° C. to about 130° C., from 70° C. to about 120° C., from 70° C. to about 110° C., or even from 80° C. to about 105° C. and a heat of fusion of at least 200 Joules/gram (J/g), at least 210 J/g, or even at least 220 J/g.

Useful polyethylene waxes are commercially available under a variety of trade designations including, e.g., the EPOLENE series of trade designations from Westlake Chemical Corporation (Houston, Tex.) including, e.g., EPOLENE N-21 and N-14 polyethylene waxes. Useful Fischer Tropsch waxes are commercially available under a variety of trade designations including, e.g., the BARECO series of trade designations from Baker Hughes Inc. (Sugar Land, Tex.) including, e.g., BARECO PX-100 and PX-105 Fischer Tropsch waxes, the SHELLWAX and SARAWAX-SX-105 series of trade designations from Shell Malaysia Ltd. (Kuala Lumpur, Malaysia) including, e.g., SHELL-WAX SX100, SX105, SX-70, and SX-80, and SARAWAX SX100 and SX105 Fischer Tropsch waxes Useful metallocene catalyzed polyethylene waxes are commercially available under a variety of trade designations including, e.g., LICOWAX from Clariant Int'l Ltd. (Muttenz, Switzerland).

Useful commercially available paraffin waxes include e.g., FR-6513 from Citgo Petroleum (Houston, Texas) and SASOLWAX 6705 from Sasol Performance Chemicals (Hamburg, Germany).

The hot melt composition can include from 0% by weight to 20% by weight, from 3% by weight to 15% by weight or even from 5% by weight to 15% by weight of the wax.

Optional Components

The hot melt composition can include optional components such as e.g., UV stabilizers (e.g., benzophenone, benzotriazole, etc.), antioxidants, hindered amine light stabilizers (HALS), flame retardants, other tackifying resins, other polymers, non-functionalized copolymers of ethylene and an alkyl acrylate (e.g., ethylene n-butyl acrylate, ethylene methacrylate and ethylene methyl methacrylate), acrylics (JONCRYL ADR, etc.), other pigments, dyes and optical brighteners.

Useful commercially available UV stabilizers include CYABSORB UV531 and CYABSORB UV 9, available from Solvay S.A. (Brussels, Belgium) and HOSTAVIN PR-25, available from Clariant.

Method of Making

The hot melt composition can be made by blending the required materials with the optional additives using known techniques for blending thermoplastics, such as, for example, extrusion or kneading. Useful methods of extrusion or kneading include internal blade or rotor mixers, an external mixer, or single-screw or corotating or counterrotating twin-screw extruder.

Hot Melt Composition in the Form of a Film

The hot melt composition is preferably used in the form of a film or sheet. The film can have a thickness ranging from 0.1 mm to 20 mm, from 0.2 mm to 20 mm, or even from 0.5 mm to 10 mm. The hot melt composition in the form of a film can be embossed.

The functionalized polymers may begin to react as they are made into a film and may continue to react in the process by which the module is made.

The film can be a monolayer (i.e., one layer consisting of the hot melt composition) or a multilayer. When it is multilayer, the hot melt composition can be present as two or more films or can be combined with layers of other materials conventionally used in the photovoltaic field e.g., polyolefins, ionomers, fluoropolymers, etc. If two or more layers are present, they can be formed in any possible way including by coextrusion.

The film can be obtained by a method selected from the group consisting of pressing, tubular (bubble) extrusion-blow molding, extrusion-laminating, extrusion-coating, flat sheet extrusion (also known as extrusion-casting) and calendaring. When extruded, a gravimetric feeder can be used to feed the various materials into the extruder.

PV Module

The hot melt composition in the form of a film can serve as an encapsulant in a PV module. The PV module can be selected from the group consisting of crystalline silicon and thin film.

The PV module can include from top (sun facing side) to bottom: a front sheet, the hot melt composition in the form of a film, a layer of photovoltaic cells in contact with the back sheet, and a back sheet. The PV module can include from top (sun facing side) to bottom: a front sheet, the hot melt composition in the form of a film, a layer of photovoltaic cells, the hot melt composition in the form of a film, and a back sheet.

In these embodiments, the layer of hot melt composition in the form of a film between the front sheet and the photovoltaic cells needs to be transparent.

When there are two layers of hot melt composition in the form of a film in the module, they can be the same composition, or they can be different compositions.

The thin film PV module can include a front sheet on which the photovoltaic cells can be deposited, the hot melt composition in the form of a film as an encapsulant, and a back sheet. The hot melt composition in the form of a film is located between the front sheet and the back sheet and adheres the assembly together.

The front sheet is the sun facing side of the panel and needs to be transparent. The front sheet can be comprised of glass or a transparent plastic (e.g., poly methyl methacrylate, polytetrafluoroethylene (ptfe), poly(ethene-co-tetrafluoroethene) (etfe), polyester, or any other transparent plastic).

The photovoltaic cells can be deposited on the front sheet, back sheet, or a separate substrate such as e.g., metal film. The photovoltaic cell can comprise a number of materials e.g. CIGS (copper indium gallium diselenide), CdTe (cadmium telluride), amorphous thin-film silicon (a-Si, TF-Si), copper indium diselenide (CIS), organics, perovskite, and combinations thereof.

In some thin film PV modules, when the photovoltaic cells are deposited on the front sheet, the encapsulant does not need to be transparent.

The back sheet can comprise glass, plastic, or metal. The back sheet can be flexible or not flexible.

In one embodiment, the front sheet and the back sheet are glass, the photovoltaic cells comprise CdTe and are deposited on the front sheet and the hot melt composition in the form of a film bonds the assembly together.

The thin film PV module can further include an edge seal. The edge seal is a material that forms a seal between the outer edges of the front sheet and back sheet to provide an extra barrier to prevent moisture from weakening the structure of the module or damaging the cells.

The edge seal is commonly based on butyl rubber but could alternately be based on polyisobutylene. The edge seal can further include a desiccant material.

The various layers can be assembled by any type of pressing technique, such as, for example, hot pressing, vacuum pressing or laminating (e.g., heat laminating). The thin film PV module can be laminated at temperatures of from 120° C. to 180° C., or even at temperatures of from 140° C. to 170° C.

The invention will now be described by way of the following examples. All parts, ratios, percents and amounts stated in the Examples are by weight unless otherwise specified.

EXAMPLES

Test Procedures

Test procedures used in the examples and throughout the specification, unless stated otherwise, include the following. The amounts of raw materials listed in Table 2 are in weight percent.

Melt Index

Melt Index can be measured according to ASTM D 1238 (190° C., 2.16 kg). Melt Index can also be estimated by using logarithmic addition.

$T_m$ and $T_g$ and Heat of Fusion According to DSC

Testing was conducted using a Mettler Toledo DSC 3 Star System as follows: Temperature lowered to 0° C. and held for 5 min, then ramped up to 150° C. at 10° C./min, ramp down to 0° C. at 10° C./min. The measurements were on first heat. If there are two peaks the highest peak is used. Note: The samples as tested according to this method have no prior heat treatment.

Storage Modulus

The Storage Modulus (G') was obtained by a dynamic mechanical analysis (DMA) temperature sweep using an ARES G2 dynamic mechanical analyzer. The following method was used. The sample was heated to 190° C. and equilibrated at 190° C. for 2 minutes and then cooled at 3° C./min at 10 rad/see to −20° C.

180° Peel Adhesion

On one end of a precleaned 3.8 centimeter (cm) (1.5 inches (in))×15.24 cm (6 in) plain window glass, an equal sized encapsulant material is placed (non embossed, having a thickness of about 0.45 mm). Between the glass and encapsulant, as a spacer, a poly(tetrafluoroethylene) (PTFE) coated release sheet is inserted on the long end of the glass such that about 3.8 cm (1.5 in)×3.8 cm (1.5 in) of the glass is fully covered, and a 3.8 cm (1.5 in)×30.5 cm (12 in) strip of a flexible polyester-based back sheet (Dun-Solar PPE+, 0.40 millimeter (mm) thick available from Dunmore), typically used in the PV industry, is laid on top. After aligning the glass, PTFE spacer, encapsulant, and backsheet, the entire sandwich assembly is carefully placed in between two large PTFE coversheets and laminated in a vacuum laminator set at a platen temperature of 160° C. with 4-min evacuation cycle followed by a 6-min press cycle. The post-laminated adhesion sample is allowed to cool to room temperature before removing the PTFE coversheets and the PTFE spacer. The sample is then conditioned under ambient laboratory conditions for 24 to 72 hours. Using a safety razor or utility knife, a 2.54 cm (1 in)×15.24 cm (6 in) strip the laminated adhesion specimen is scored from the backsheet-side in the middle of the sample and inspected from the glass side to confirm a clean cut through the encapsulant to the glass. With the glass side down, the backsheet is pulled back and using a razor knife the glass-encapsulant interface is very carefully and intentionally separated to expose and initiate the glass-encapsulant adhesion failure mode.

The prepared specimen is then mounted on a tensile testing machine (Com-Ten 95-Series) in a 180° peel configuration and the force required to peel the encapsulant from the glass interface at a rate of 200 mm/min is recorded. The peel force is measured for at least 2.54 cm (1 in) of glass-encapsulant adhesion failure and an average of three samples is used to report peel/adhesion strength in Newtons (N)/cm.

TABLE 1

| Polymer Type | Comonomer Content | Melt Index (g/10 min) ASTM D1238(190° C., 2.16 kg) | Brookfield Viscosity @ 190° C. (cP) | Density (g/cm³) | $T_m$ (° C.) |
|---|---|---|---|---|---|
| VISTAMAXX 6202 | PP/PE copolymer | 15% by wt. ethylene | 9.1 | | 0.962 | |
| AERAFIN 75H | PP/PE copolymer | 19% by wt. ethylene | | 7500 | | 100.3 |
| AERAFIN 180 | PP/PE copolymer | 18% by wt. ethylene | | 18000 | | 101.3 |
| LMODU S-901 | PP homopolymer | | | | | |
| ENGAGE 8411 | PE/Octene copolymer | | | 18 | 0.880 | 76 |
| LOTADER 4210 | PE/BA/MA terpolymer | 6.5% by wt. BA, 3.6% by wt. maleic anhydride | | 10 | | |
| LOTADER AX 8840 | PE/glycidyl methacrylate copolymer | 6-8% by wt. glycidyl methacrylate | | 5 | | |

AERAFIN polymers $T_m$ obtained by ASTM D3418. ENGAGE 8411 $T_m$ tested by Dow Method.

TABLE 2

| | Comp 1 | Comp 2 | Ex 1 | Ex 2 | Ex 3 | Ex 4 | Ex 5 | Ex 6 | Ex 7 | Ex 8 | Ex 9 | Ex 10 | Ex 11 | Ex 12 | Ex 13 |
|---|---|---|---|---|---|---|---|---|---|---|---|---|---|---|---|
| VISTAMAXX 6202 | 90.4 | | | | 40.4 | | | | | | | | | | 23.4 |
| AERAFIN 75H | | 49.9 | 47.9 | 52.9 | | 45.4 | | 35.4 | 45.4 | 47.9 | 47.9 | 46.8 | 50 | 43.6 | 23.4 |
| LMODU S-901 | | | | | | | 50.4 | | | | | | | | |
| ENGAGE 8411 | | 42 | 46.5 | 37.5 | 30 | | 40 | 55 | 45 | 47 | 47 | 46.8 | 43.6 | 50 | 46.8 |
| ENGAGE 8130 | | | | | | 37.5 | | | | | | | | | |
| AFFINITY GA 1000R | | | 5 | | | | | | | | | | | | |
| LOTADER AX 8840 | 4.5 | | | 4.5 | 4.5 | 4.5 | 4.5 | 4.5 | 4.5 | 4.5 | 0 | 3 | 3 | 3 | 3 |
| LOTADER 4210 | 4.5 | | | 4.5 | 4.5 | 4.5 | 4.5 | 4.5 | 4.5 | 0 | 4.5 | 3 | 3 | 3 | 3 |
| ESCOREZ 5320 | | | | | 10 | | | | | | | | | | |
| SX-105 | | 7.5 | | | 10 | 7.5 | | | | | | | | | |
| DYNASYLAN GLYMO | 0.5 | 0.5 | 0.5 | 0.5 | 0.5 | 0.5 | 0.5 | 0.5 | 0.5 | 0.5 | 0.5 | 0.3 | 0.3 | 0.3 | 0.3 |
| HOSTAVIN PR-25 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| G' @ 0° C. (MPa) | 2.78 | 13.8 | 8.28 | 11.9 | 11.5 | 15.3 | 50.5 | 12.9 | 10.2 | 9.75 | 10.6 | 11.3 | 10.2 | 10.5 | 9.25 |

TABLE 2-continued

| | Comp 1 | Comp 2 | Ex 1 | Ex 2 | Ex 3 | Ex 4 | Ex 5 | Ex 6 | Ex 7 | Ex 8 | Ex 9 | Ex 10 | Ex 11 | Ex 12 | Ex 13 |
|---|---|---|---|---|---|---|---|---|---|---|---|---|---|---|---|
| G' @ 25° C. (MPa) | 1.47 | 5.66 | 3.00 | 4.53 | 5.82 | 6.76 | 7 | 5.02 | 3.84 | 3.78 | 4.02 | 4.14 | 3.89 | 3.93 | 3.67 |
| G' @ 50° C. (MPa) | 0.24 | 0.45 | 0.62 | 1.28 | 2.36 | 2.26 | 0.67 | 1.45 | 1.07 | 0.907 | 0.99 | 1.03 | 1.08 | 0.89 | 1.06 |
| G' @ 75° C. (MPa) | 0.1 | 0.095 | 0.017 | 0.087 | 0.56 | 0.21 | 0.12 | 0.077 | 0.11 | 0.051 | 0.05 | 0.06 | 0.061 | 0.46 | 0.076 |
| 180 Peel Adhesion (N/cm) | 3.9 | <8.8 | 42.9 | 55.7 | 54.1 | 90.7 | N.T. | 100.8 | 104.1 | 120.2 | 108.9 | 95.4 | 76.9 | 116.1 | 116.8 |

Other embodiments are within the claims.

What is claimed is:

1. A hot melt composition in the form of a film comprising:

from 20% by weight to 60% by weight of a propylene based copolymer having a comonomer content of from 9% by weight to 22% by weight, that is a non-single site catalyzed APAO having Brookfield Viscosity at 190° C. of no greater than 20,000 cP, and has a Tm by DSC of no more than 105° C. as tested by ASTM D3418, a. from 35% by weight to 65% by weight of an ethylene based polymer having a density of no more than 0.90 g/cm3, and b. from 2% by weight to 15% by weight of a functionalized polymer having a melt index as tested by ASTM D 1238 (190° C., 2.16 kg) of from 2 g/10 min to 100 g/10 min and comprising a functional group selected from the group consisting of epoxides, carboxylic anhydrides, and carboxylic acids, and c. a silane adhesion promoter.

2. The hot melt composition of claim 1 wherein the propylene based polymer is a propylene ethylene copolymer.

3. The hot melt composition of claim 1 wherein the propylene based polymer is produced in the presence of a catalyst system selected from a Ziegler-Natta catalyst, a catalyst system including at least one electron donor and combinations thereof.

4. The hot melt composition of claim 1 wherein the propylene based copolymer has a comonomer content of from 12% by weight to 22% by weight.

5. The hot melt composition of claim 1 wherein the ethylene based polymer is a single site catalyzed copolymer.

6. The hot melt composition of claim 1 wherein the ethylene based polymer is selected from the group consisting of very low density polyethylene (VLDPE), low density polyethylene (LDPE) and linear low density polyethylene (LLDPE).

7. The hot melt composition of claim 1 wherein the functionalized polymer is selected from the group consisting of copolymer of ethylene and maleic anhydride, copolymer of ethylene, alkyl(meth)acrylate and maleic anhydride, copolymer of ethylene and glycidyl methacrylate and terpolymer of ethylene, alkyl(meth)acrylate and glycidyl methacrylate.

8. The hot melt composition of claim 1 wherein the functionalized polymer is present as a first and a second functionalized polymer, the first functionalized polymer is selected from the group consisting of copolymer of ethylene and maleic anhydride, copolymer of ethylene, alkyl(meth)acrylate and maleic anhydride and, the second functionalized polymer is selected from a group consisting of copolymer of ethylene and glycidyl methacrylate and terpolymer of ethylene, alkyl(meth) acrylate and glycidyl methacrylate.

9. The hot melt composition of claim 1 being free of ethylene vinyl acetate, peroxide, and poly vinyl chloride.

10. The hot melt composition of claim 1 having an approximate Melt Index of from 5 g/10 min to 150 g/10 min as tested according to ASTM D 1238 (190° C., 2.16 kg).

11. The hot melt composition of claim 1 further comprising from 5% by weight to 50% by weight of a filler.

12. The hot melt composition of claim 1 further comprising at least one of a tackifying agent and a wax.

13. A photovoltaic module comprising the hot melt composition in the form of a film of claim 1.

14. A photovoltaic module comprising from top to bottom:

a. a front sheet, b. the hot melt composition in the form of a film of claim 1, c. a layer of photovoltaic cells, d. the hot melt composition in the form of a film of claim 1, and e. a back sheet, wherein the hot melt composition in the form of a film adheres the front sheet to the back sheet.

15. A photovoltaic module comprising:

a. a front sheet, b. a layer of photovoltaic cells in contact with the front sheet, c. the hot melt composition in the form of a film of claim 1, and d. a back sheet, wherein the hot melt composition in the form of a film is located between the photovoltaic cells and the back sheet and adheres the front sheet to the back sheet.

16. The photovoltaic module of claim 15 wherein the photovoltaic cells are selected from the group consisting of CIGS (copper indium gallium diselenide), CdTe (cadmium telluride), amorphous thin-film silicon (a-Si, TF-Si), copper indium diselenide (CIS), perovskite based systems and combinations thereof.

17. The photovoltaic module of claim 15 wherein the back sheet and the front sheet are glass, and the photovoltaic cells are CdTe.

* * * * *